US006691275B1

United States Patent
Jaeckel (12)

(10) Patent No.: US 6,691,275 B1
(45) Date of Patent: Feb. 10, 2004

(54) ENCODER WITH VECTOR-CALCULATED DISPARITY LOGIC

(75) Inventor: Silvia E. Jaeckel, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 459 days.

(21) Appl. No.: 09/736,989

(22) Filed: Dec. 14, 2000

(51) Int. Cl.[7] .............................................. H03M 13/00
(52) U.S. Cl. ......................... 714/752; 714/800; 341/59
(58) Field of Search ........................ 714/752, 772–773, 714/800; 341/58, 101; 386/2

(56) References Cited

U.S. PATENT DOCUMENTS 4,376,290 A * 3/1983 Shirota ........................... 386/2
4,486,739 A * 12/1984 Franaszek et al. ............. 341/59
5,012,240 A * 4/1991 Takahashi et al. ........... 341/101

* cited by examiner

Primary Examiner—Guy J. Lamarre
(74) Attorney, Agent, or Firm—Suiter-West PC LLO

(57) ABSTRACT

A novel method and apparatus for encoding input data at a faster rate provides error detection, clock recovery, and reduction of spectral components near DC, and is capable of encoding data while embedding error detection information simultaneously. This encoding scheme may encode all input data in parallel while simultaneously embedding error detection information to quickly and properly encode input data.

28 Claims, 5 Drawing Sheets

ENCODER WITH VECTOR-CALCULATED DISPARITY LOGIC

FIELD OF THE INVENTION

The present invention relates generally to high speed data encoding and more particularly to encoding utilizing vector-calculated embedded-error-detection logic.

BACKGROUND OF THE INVENTION

Data encoding and transmission schemes are well known to the art to provide error detection, clock recovery, and reduction of spectral components near DC. Incoming data is transformed into an encoded value for transmission. The output of the encoder may be a series of 0's and 1's. Decoding may recover the original incoming data along with some additional information. This additional information may include whether an incoming character contains any errors.

An error tracking scheme may be provided within the data itself. For instance, one type of error tracking scheme utilizes a running disparity. Running disparity refers to the number of 1's in comparison to the number of 0's of an encoded word. A running disparity is positive when there are more 1's than 0's. A running disparity is negative when there are more 0's than 1's. An equal number of 1's and 0's is referred to as a neutral running disparity. Data may be encoded such that a desired running disparity is maintained at specific check points. An error may be assumed on the decoding side if, after error recovery, the running disparity does not have the desired value at a specified check point.

In encoding schemes known to the art, an input word to be encoded is divided into a number of sub-blocks. A current running disparity is derived after each sub-block from the encoded sub-block data and the previous running disparity. The current running disparity, in turn, becomes the previous running disparity for the next sub-block in the current input word or first sub-block in the next input word. The previous running disparity determines the encoded value of the sub-block to which it is applied. In this process, a current running disparity must be determined after each sub-block is encoded and must be applied to the next sub-block or the next input word. Thus encoding of a sub-block may not occur until the previous sub-blocks have been encoded. As a result, the encoding of input words utilizing this process is slow.

Consequently, it would be advantageous if a data encoding scheme existed which allowed for high speed data encoding. Further, it would be advantageous to provide a data encoding scheme which could encode data while embedding error detection information simultaneously.

SUMMARY OF THE INVENTION

Accordingly, the present invention is directed to a novel system and method for encoding which may provide increased data rates while maintaining error detection, clock recovery and reduction of spectral components near DC. The present invention is further directed to an encoding scheme which may encode data while embedding error detection information simultaneously.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to an embodiment of the invention, examples of which are illustrated in the accompanying drawings.

Figure 1:
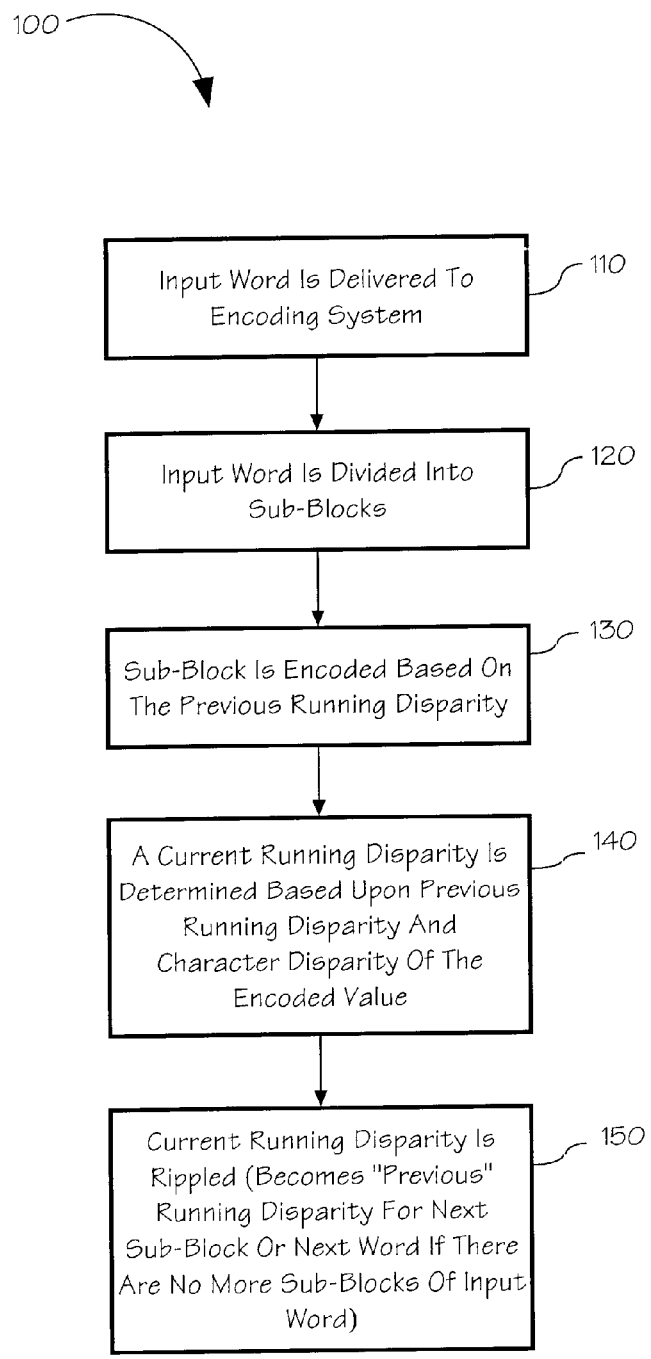
FIG. 1 depicts an embodiment of a process of an encoding scheme known to the art.

Referring to FIG. 1, an embodiment of a process of an encoding scheme 100 known to the art is shown. A first step in an encoding process known to the art is delivery of an input word to an encoding system 110. Typically, it is well-known in the art to divide an input word into sub-blocks 120. This may allow for easier encoding of the individual sub-blocks as understood by those with ordinary skill in the art. The encoded sub-blocks are then combined to form an encoded word. Each sub-block is encoded based upon the previous running disparity 130.

The previous running disparity to the first sub-block of an input word is the ending running disparity of the previous input word to the encoder or a starting running disparity upon reset of the encoder. A current running disparity is determined after each sub-block based upon the previous running disparity applied to the sub-block and the character disparity of the encoded sub-block 140. The current running disparity becomes the previous running disparity for the next sub-block or the ending running disparity if there are no more sub-blocks in the current input word 150. The previous running disparity applied to a sub-block influences the encoding of this sub-block. Each sub-block may involve an iteration of the process producing a current running disparity and applying it to the next sub-block. The process of determining a current running disparity and applying it to the next sub-block as a previous running disparity is referred to by those with ordinary skill in the art as rippling.

Figure 2:
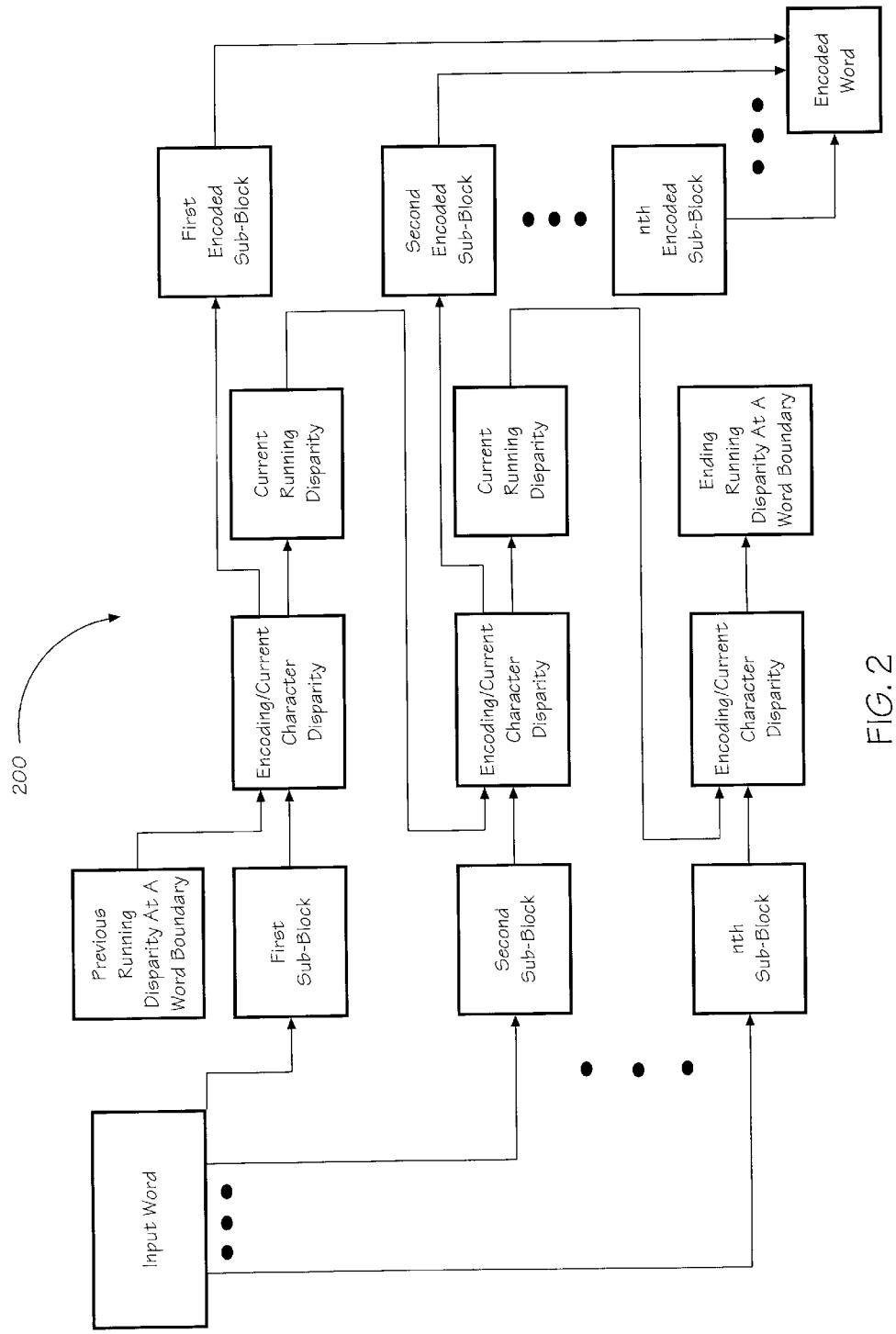
FIG. 2 depicts an embodiment of an encoding scheme known to the art in a block diagram form.

Referring now to FIG. 2, an embodiment of an encoding scheme 200 known to the art in a block diagram form is shown detailing the rippling nature of the process. The previous running disparity at the beginning of the input word becomes the previous running disparity for the first sub-block in the input word. The first sub-block is encoded based upon its data value and its previous running disparity. A current running disparity is calculated based upon the character disparity of the first encoded sub-block and its previous running disparity.

The current running disparity becomes the previous running disparity for the second sub-block. The second sub-block is encoded based upon its data value and its previous running disparity. Once again, a current running disparity is calculated based upon the character disparity of the second encoded sub-block and its previous running disparity. This process may extend to n iterations based upon the number of sub-blocks. The encoded sub-blocks are combined to form an encoded word. While effective for its intended purpose of encoding, completion of multiple iterations slows the encoding process and thus limits the data rate for transmission.

Figure 3:
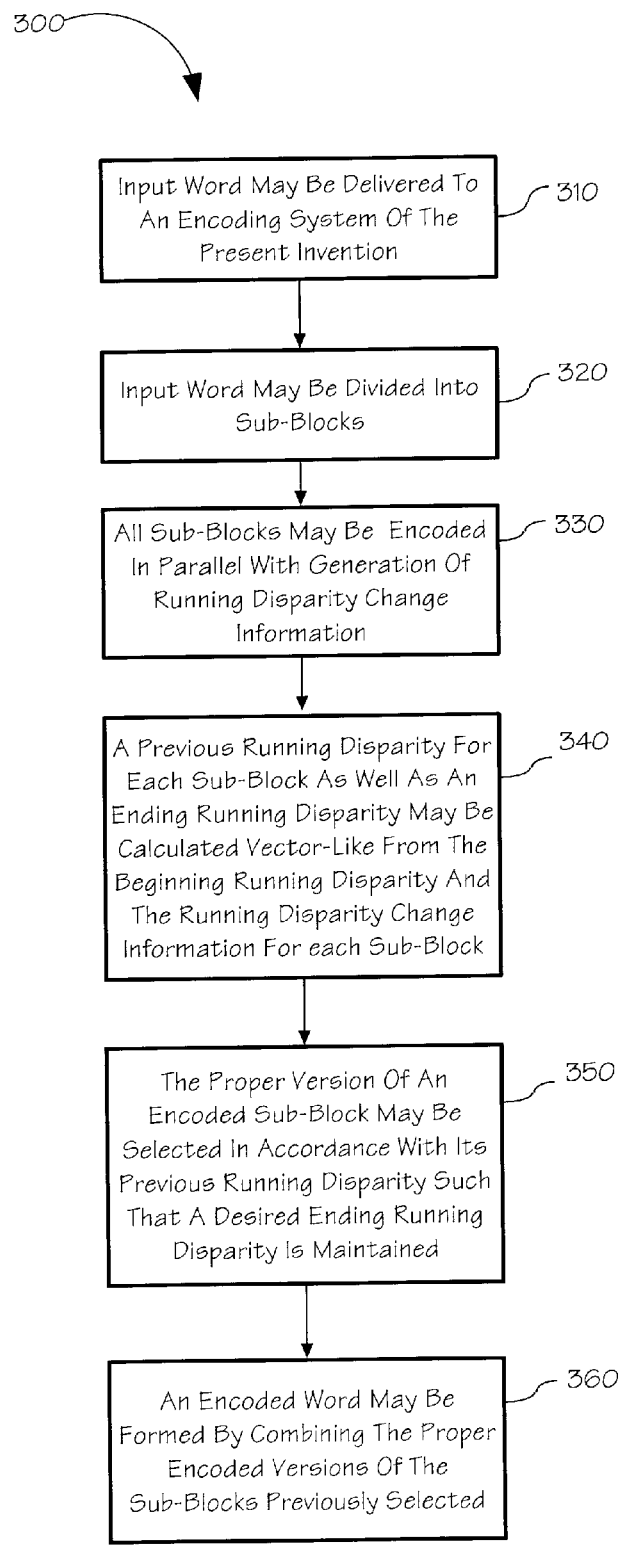
FIG. 3 depicts an embodiment of a process of an encoding scheme of the present invention.

Referring now to FIG. 3, an embodiment of a process of an encoding scheme 300 of the present invention is shown. The encoding scheme of the present invention may encode data while embedding error detection information simultaneously. In one embodiment of the present invention, encoding of an input word may be accomplished simultaneously with disparity calculations to embed error detection information in the data. For example, as shown in FIG. 3 an input word may be delivered to an encoding system for encoding 310. The word may be divided into sub-blocks 320 in accordance with the desired type and form of encoding. However, division of the input word into sub-blocks may not be required depending upon the size of the input word and desired type and form of encoding.

In encoding of sub-blocks, a certain input value may be encoded to form more than one valid encoded value. The various, valid encoded values may differ in their character disparities. In encoding schemes known to the art, the proper encoded value is output based upon the previous running disparity such that a desired overall running disparity is maintained. This is extremely time consuming as a result of determining a current running disparity and applying it as a previous running disparity to the next sub-block serially on a sub-block by sub-block basis as described in FIGS. 1–2.

In the present invention, all valid encoded values of an input value are generated along with additional information pertaining to how the encoded value will change the running disparity 330. This additional information may be referred to as running disparity flip information. A running disparity flip for each sub-block may be determined from the character disparity of that sub-block. Under a vector calculation scheme of the present invention, a previous running disparity for each sub-block as well as an ending running disparity may be calculated in parallel from the previous running disparity at the beginning of the input word and a vector containing disparity flip information for each sub-block 340. The calculated previous running disparities form likewise a vector which is used to select the proper encoded version of sub-blocks such that a desired running disparity at the end of the input word is maintained 350. An encoded word may be formed by combining the proper encoded versions of the sub-blocks previously selected 360.

Figure 4:
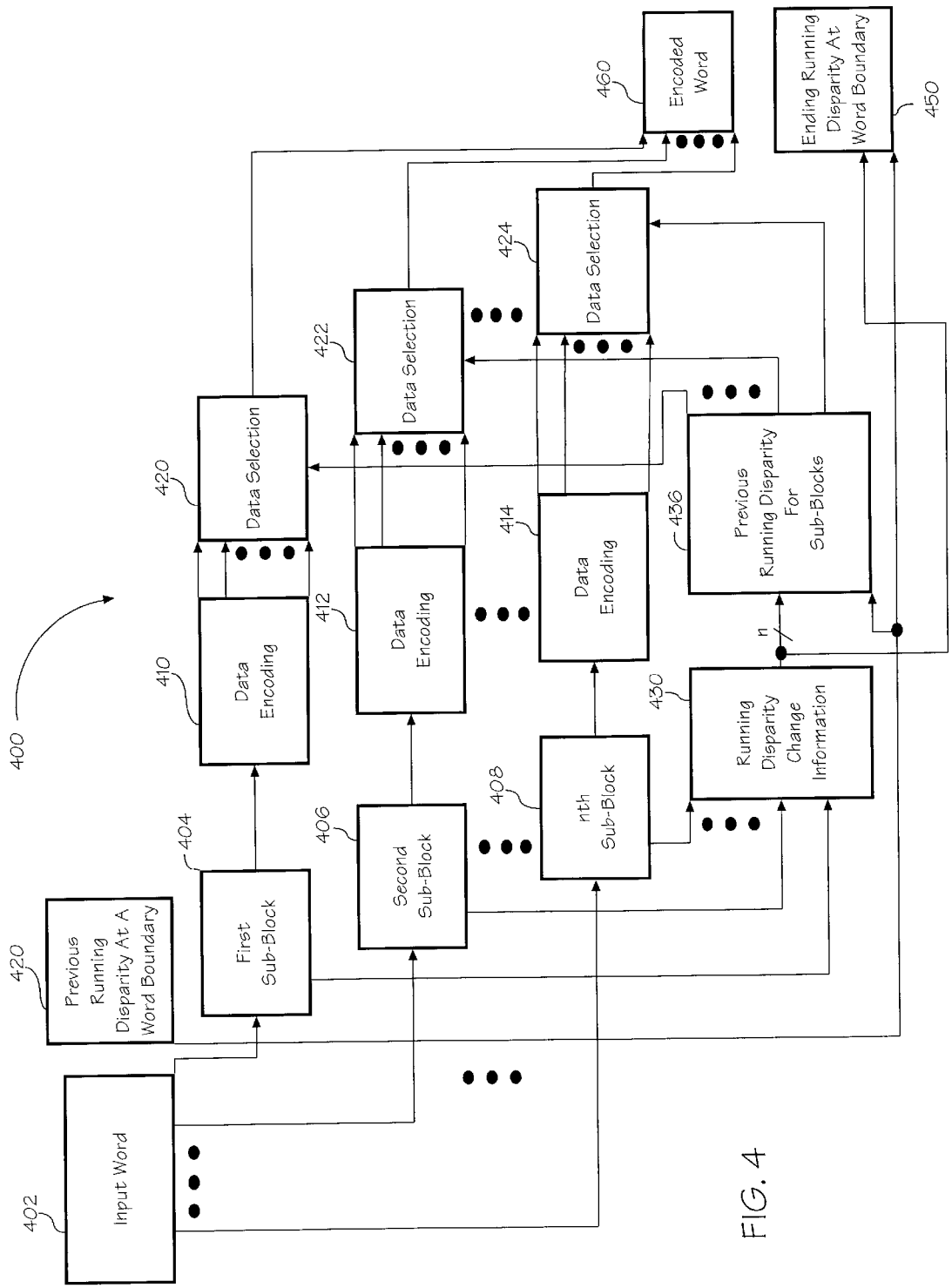
FIG. 4 depicts an embodiment of an encoding scheme in accordance with the present invention in a block diagram form.

Referring to FIG. 4, an embodiment of a process 400 of an encoding scheme in accordance with the present invention in block diagram form is shown. An input word 402 may be divided into n sub-blocks 404–408 to aid in the encoding of the input word. While this may be beneficial in the encoding process, the encoding scheme of the present invention may be employed by one of ordinary skill in the art without dividing an input word into sub-blocks without departing from the scope and spirit of the present invention. All sub-blocks of the input word are encoded in parallel generating all valid encoded values for each sub-block 410–414 while simultaneously generating the disparity flip information for each sub-block. A previous running disparity at a word boundary 420 may be utilized along with the generated running disparity flip information to calculate a previous running disparity for each of the sub-blocks 436 and an ending running disparity 450. The calculated previous running disparity information for each sub-block is then used to select for each sub-block the encoded value with the character disparity 420–424 such that after assembling the encoded word 460 a desired running disparity is maintained. A previous running disparity at a word boundary 420 may be a starting running disparity after a reset or may be the ending running disparity of the previous input word.

An advantage of this type of process is the lack of a requirement to determine a current running disparity after each sub-block is encoded and apply it as the previous running disparity to the next sub-block before the next sub-block may be encoded. Encoding steps alternated with disparity manipulations applied serially slows the encoding process. Under an embodiment of the present invention, all sub-blocks may be encoded in parallel while simultaneously calculating in parallel the previous running disparity for all sub-blocks as well as the ending running disparity.

Figure 5:
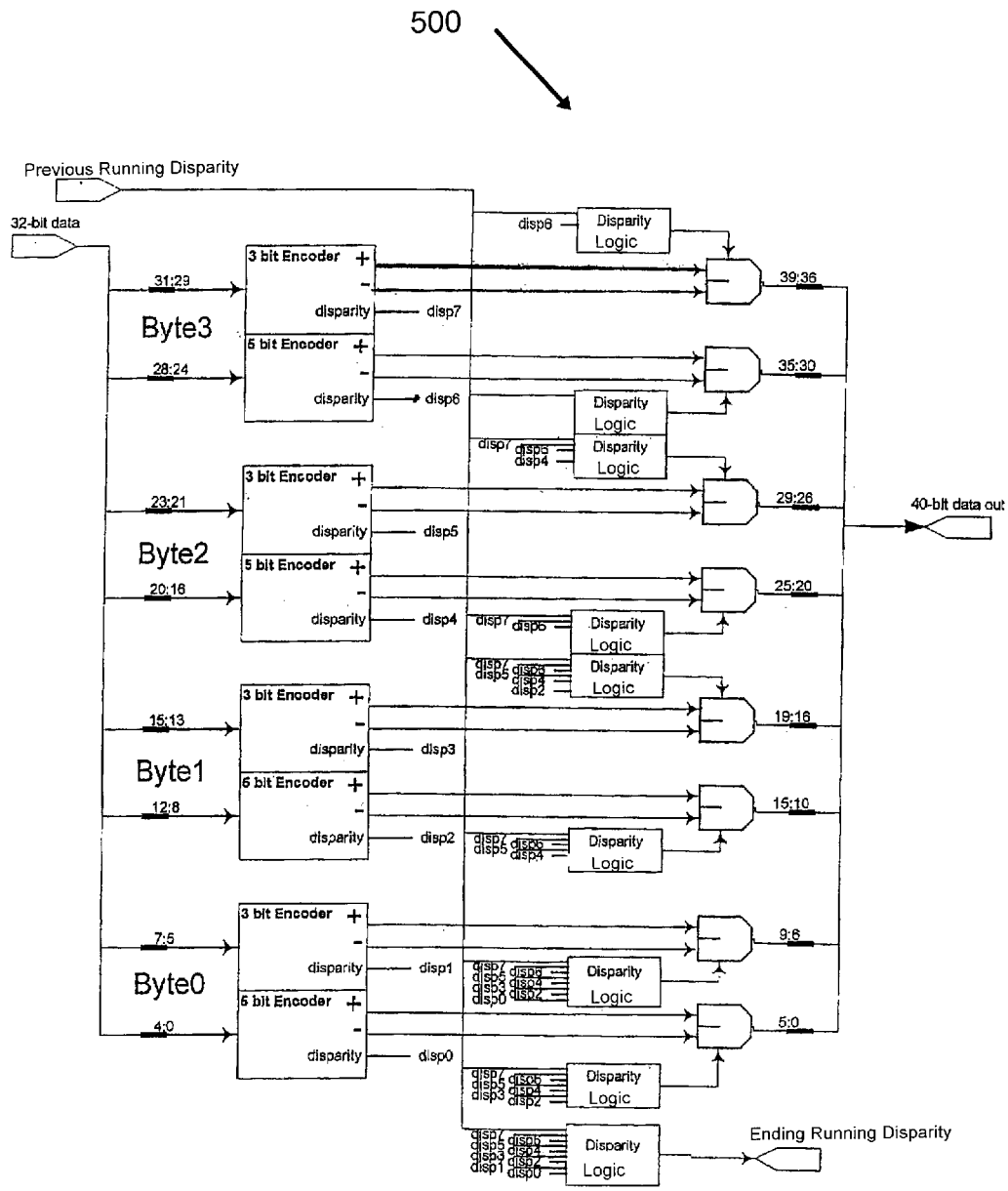
FIG. 5 depicts an embodiment of an 8 bit to 10 bit (8 B/10 B) encoding scheme in accordance with the present invention.

Referring now to FIG. 5, an embodiment of an 8 B/10 B encoding scheme in accordance with the present invention is shown. One type of encoding scheme which can incorporate the advantageous aspects of the present invention is an 8 B/10 B encoding scheme. However, the advantageous aspects and principles of the present invention may be incorporated into other types of encoding schemes by one of ordinary skill in the art without departing from the scope and spirit of the present invention.

In the embodiment as shown in FIG. 5, a 32-bit word may be divided into sub-blocks of 3-bit values and 5-bit values. After encoding, a 40-bit encoded value may be formed. In accordance with the present invention, encoding of all 3-bit and 5-bit values may generate a positive character disparity version and a negative character disparity version of the encoded value for each 3-bit and 5-bit input value. Simultaneously, running disparity flip information may be generated in parallel for all 3-bit and 5-bit sub-blocks. The portion marked "disp" in FIG. 5 refers to the running disparity flip information. The ending running disparity as well as the previous running disparities for all sub-blocks are calculated in parallel from the previous running disparity at the beginning of the 32-bit input word and the running disparity flip vector ("disp0" through "disp7").

The proper encoded value for each sub-block is selected in accordance with the corresponding previous running disparity for the sub-block. The output value for a 8 B/10 B encoding scheme is chosen such that the ending running disparity remains at a +1 or −1 disparity. When a sub-block is encoded, a character disparity of +2, −2 or 0 for each sub-block is possible. If the character disparity is non-neutral (i.e. not 0), it may be known that a flip in the running disparity may occur. If the running disparity at the beginning of the input word is −1 and the running disparity at the end of the input word is to be maintained at −1, then the sub-block causing a disparity flip must be followed by a sub-block causing a complementary disparity flip to offset the first. For example, in Byte 3 a 5-bit input value is encoded. Based upon the previous running disparity at the beginning of the 32-bit word, the proper version is selected. Implementation of this function may be performed by a multiplexor. The 3-bit input value may also be encoded. However, the proper version is selected based upon the previous running disparity at the beginning of the 32-bit word and whether or not the 5-bit encoded value may cause a change in the running disparity as indicated by the running disparity flip information ("disp6"). The process is performed in parallel for each byte.

While an example of an 8 B/10 B type of encoding scheme has been presented in accordance with the present invention, the present invention is not limited to this specific type of encoding. Further, the invention is not limited to a running disparity type of error detection mechanism. Rather, the present invention includes various types of error detection with the characteristic of embedding error detection information in the data itself during the encoding process. For example, a type of error detection system that embeds error detection information in the data other than running disparity information may be utilized by one of ordinary skill in the art without departing from the scope and spirit of the present invention.

Further, it is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of high-speed encoding of an input word, comprising:
   (a) encoding at least two input values of an input word simultaneously to all versions of an encoded value for each of said at least two input values;
   (b) determining a previous running disparity for each of said at least two input values simultaneously with said encoding of said at least two input values;
   (c) calculating an ending running disparity; and
   (d) selecting a proper version of encoded value for each of said at least two input values;
   wherein said ending running disparity is calculated from a beginning running disparity and running disparity flips for each of said at least two input values, said proper version of encoded value for each of said at least two input values being selected in accordance with said previous running disparity for each of said at least two input values and a desired running disparity.

2. The method as claimed in claim 1, wherein said at least two input values are divided portions of said input word.

3. The method as claimed in claim 1, wherein said all versions of said encoded value comprise at least one of a neutral character disparity, a positive character disparity, and a negative character disparity.

4. The method as claimed in claim 1, wherein said previous running disparity is determined by at least one of said beginning running disparity and a value determined by said beginning running disparity and running disparity flips for each of said at least two input values.

5. The method as claimed in claim 4, wherein running disparity flips are determined by said beginning running disparity and a character disparity of each of said at least two input values.

6. The method as claimed in claim 1, wherein said beginning running disparity includes a starting running disparity after a reset of an encoding system and an ending running disparity of a previously encoded input word.

7. The method as claimed in claim 1, wherein said desired running disparity is in accordance with a particular type of data encoding scheme.

8. The method as claimed in claim 7, wherein said desired running disparity is −1 and +1 running disparity in an eight-bit to ten-bit data encoding scheme.

9. The method as claimed in claim 1, wherein said encoding of at least two input values of an input word, said determining of said previous running disparity, and said calculating of an ending running disparity are performed simultaneously.

10. A high-speed encoding system, comprising:
    (a) means for encoding at least two input values of an input words simultaneously to all version of an encoded value for each input value;
    (b) means for calculating a previous running disparity for each of said at least two input values, said means for calculating a previous running disparity operating simultaneously with said encoding means;
    (c) means for calculating an ending running disparity; and
    (d) means for selecting a proper version of encoded value for each of said at least two input values; wherein said ending running disparity is calculated from a beginning running disparity and running disparity flips for each of said at least two input values, said proper version of encoded value for each of said at least two input values being selected in accordance with said previous running disparity for each of said at least two input values and a desired running disparity.

11. The system as claimed in claim 10, wherein said at least two input values are divided portions of said input word.

12. The system as claimed in claim 10, wherein said all versions of said encoded value comprise at least one of a neutral character disparity, a positive character disparity, and a negative character disparity.

13. The system as claimed in claim 10, wherein said previous running disparity is at least one of said beginning running disparity and a value determined by said beginning running disparity and a number of running disparity flips.

14. The system as claimed in claim 13, wherein running disparity flips are determined by said beginning running disparity and a character disparity of each of said at least two input values.

15. The system as claimed in claim 10, wherein said beginning running disparity includes a starting running disparity after a reset of an encoding system and an ending running disparity of a previously encoded input word.

16. The system as claimed in claim 10, wherein said desired running disparity is in accordance with a particular type of data encoding scheme.

17. The system as claimed in claim 16, wherein said desired running disparity is −1 and +1 running disparity in an eight-bit to ten-bit data encoding scheme.

18. The system as claimed in claim 10, wherein said encoding means of at least two input values of an input word, said means determining of said running disparity flip attribute, and said calculating means of an ending running disparity are performed simultaneously.

19. A method of encoding 8 bits to 10 bits, comprising:
    (a) encoding at least two input values of an eight-bit input word simultaneously to all versions of an encoded value for each of said at least two input values;
    (b) determining a previous running disparity for each of said at least two input values simultaneously with said encoding of said at least two input values;
    (c) calculating an ending running disparity; and
    (d) selecting a proper version of encoded value for each of said at least two input values;
    wherein said ending running disparity is calculated from a beginning running disparity and running disparity flips for each of said at least two input values, said proper version of encoded value for each of said at least two input values being selected in accordance with said previous running disparity for each of said at least two input values and a desired running disparity.

20. The method as claimed in claim 19, wherein said at least two input values are at least one of 3 bits and 5 bits of said input word.

21. The method as claimed in claim 19, wherein said all versions of said encoded value comprise at least one of a neutral character disparity, a positive character disparity, and a negative character disparity.

22. The method as claimed in claim 19, wherein said previous running disparity is determined by at least one of said beginning running disparity and a value determined by said beginning running disparity and a number of running disparity flips.

23. The method as claimed in claim 19, wherein running disparity flips are determined by said beginning running disparity and a character disparity of each of said at least two input values.

24. The method as claimed in claim 19, wherein said desired running disparity is −1 and +1 running disparity.

25. The method as claimed in claim 1 wherein said beginning running disparity includes a starting running disparity after a reset of an encoding system and an ending running disparity of a previously encoded input word.

26. The method as claimed in claim 19, wherein said encoding of at least two input values of an eight-bit input word, said determining of said previous running disparity, and said calculating of an ending running disparity are performed simultaneously.

27. A method of encoding a data word, comprising:

(a) delivery of an input word;

(b) embedding of error detection information into said input word; wherein said embedding of error detection information includes analyzing a calculated a previous running disparity for each block of said input word and an ending running disparity for said encoded word; and (c) encoding said input word simultaneously with said embedding of error detection information; wherein said input word is encoded into an encoded word in accordance with a desired set of encoding standards.

28. The method as claimed in claim 27, wherein said desired set of encoding standards includes a desired ending running disparity.

* * * * *